United States Patent [19]

Sevenhans et al.

[11] Patent Number: 5,095,290
[45] Date of Patent: Mar. 10, 1992

[54] AMPLITUDE MODULATOR HAVING NEGATIVE FEEDBACK CIRCUIT FOR REDUCING DISTORTION

[75] Inventors: Joannes M. J. Sevenhans, Brasschaat; Erik M. R. Vanden Abeele, Deinze, both of Belgium

[73] Assignee: Alcatel N.V.

[21] Appl. No.: 679,450

[22] Filed: Apr. 2, 1991

[30] Foreign Application Priority Data

Apr. 13, 1990 [EP] European Pat. Off. ........ 90200923.2

[51] Int. Cl.[5] .............................................. H03C 1/54
[52] U.S. Cl. .................................... 332/152; 332/162; 332/178; 455/108
[58] Field of Search ............... 332/151, 152, 162, 178, 332/168; 455/108, 46, 109

[56] References Cited

U.S. PATENT DOCUMENTS 4,547,752 10/1985 Shinbara ..................... 332/178 X

FOREIGN PATENT DOCUMENTS 0040274 11/1981 European Pat. Off. .
0226255 6/1987 European Pat. Off. .

Primary Examiner—Siegfried H. Grimm
Attorney, Agent, or Firm—Ware, Fressola, Van Der Sluys & Adolphson

[57] ABSTRACT

Modulator circuit (MOD) with a modulator proper and a correction signal generator. The modulator proper comprises the cascade connection of an amplifier (T11, T21, CS11, T12, T22, CS12) and a first switching circuit (R11, T31, T51, R12, T32, T52), while the generator comprises the cascade connection of the same amplifier and a second switching circuit (R21, T61, T42, R22, T62, T41) having a correction output (P11, P12) coupled to a feedback input (P21, P22) of the amplifier via a feedback circuit (T71, R31, CS21, T72, R32, CS22). The amplifier and the switching circuits are controlled by a modulating signal and a carrier signal respectively and the first and second switching circuits provide a modulated output signal and a correction signal substantially equal to the envelope of the modulated output signal and used to decrease the modulator distortion.

7 Claims, 2 Drawing Sheets

AMPLITUDE MODULATOR HAVING NEGATIVE FEEDBACK CIRCUIT FOR REDUCING DISTORTION

BACKGROUND OF THE INVENTION

1. Field of the Invention

The present invention relates to a modulator circuit which includes the cascade connection, between the poles of a DC supply source, of a switching circuit and of an amplifier circuit and is adapted to modulate the amplitude of a carrier signal applied to a carrier input of said switching circuit with a modulating signal applied to a modulating input of said amplifier circuit, thereby producing a modulated output signal at a modulator output of said switching circuit.

2. Description of the Prior Art

Such a modulator circuit is already known in the art, e.g. from the book "Bipolar and MOS Analog Integrated Circuit Design" by A. Grebene, J. Wiley and Sons, New York 1984 and more particularly from pages 469 to 472 thereof. Therein the amplifier circuit is a so-called differential pair which includes two transistors whose emitters are coupled to a pole of the DC supply source via individual emitter degeneration resistances and a common constant current source, the bases of these transistors constituting the terminals of the modulating input. The switching circuit comprises two load resistances and two differential pairs each including two transistor switches with joined emitters and the bases of which are connected to terminals of the carrier input. The other pole of the DC supply source is connected to the collectors of the transistors of the amplifier circuit via two circuits each comprising one of the load resistances and the collector-to-emitter paths of two of the transistor switches, one of each differential pair. The purpose of the emitter degeneration resistances is to improve the linearity of the amplifier circuit. However, they have no effect on the distortion introduced in the modulated output signal by the limited speed of operation of the transistor switches driven by the carrier input signal.

SUMMARY OF THE INVENTION

An object of the present invention is to provide a modulator circuit of the above type, but with a lowered distortion.

According to the invention this object is achieved due to the fact that the modulator circuit also includes a correction signal generating circuit which also includes said amplifier circuit and derives therefrom at a correction output a correction signal substantially equal to the envelope of said modulated output signal, and a negative feedback circuit linking said correction output to a feedback input of said amplifier circuit.

Because the correction signal has the same envelope as the modulated output signal it also has the same distortion and by feeding it back to the amplifier circuit which is common to both the modulator circuit proper, including the first mentioned switching circuit, and the correction signal generating circuit a modulated output signal with lowered distortion is obtained.

Another characteristic feature of the present modulator circuit is that said correction signal generating circuit includes the cascade connection, between the poles of said DC supply source, of a second switching circuit having said correction output and of said amplifier circuit having said feedback input, said second switching circuit being similar to said first mentioned switching circuit.

By using a second switching circuit similar to the first one the generation of a correction signal having the same envelope as the modulated output signal is facilitated since both these signals are submitted to like distortions in the common amplifier circuit as well as in the similar switching circuits.

DESCRIPTION OF THE DRAWINGS

The above mentioned and other objects and features of the invention will become more apparent and the invention itself will be best understood by referring to the following description of an embodiment taken in conjunction with the accompanying drawings wherein.

DESCRIPTION OF THE INVENTION

Figure 1:
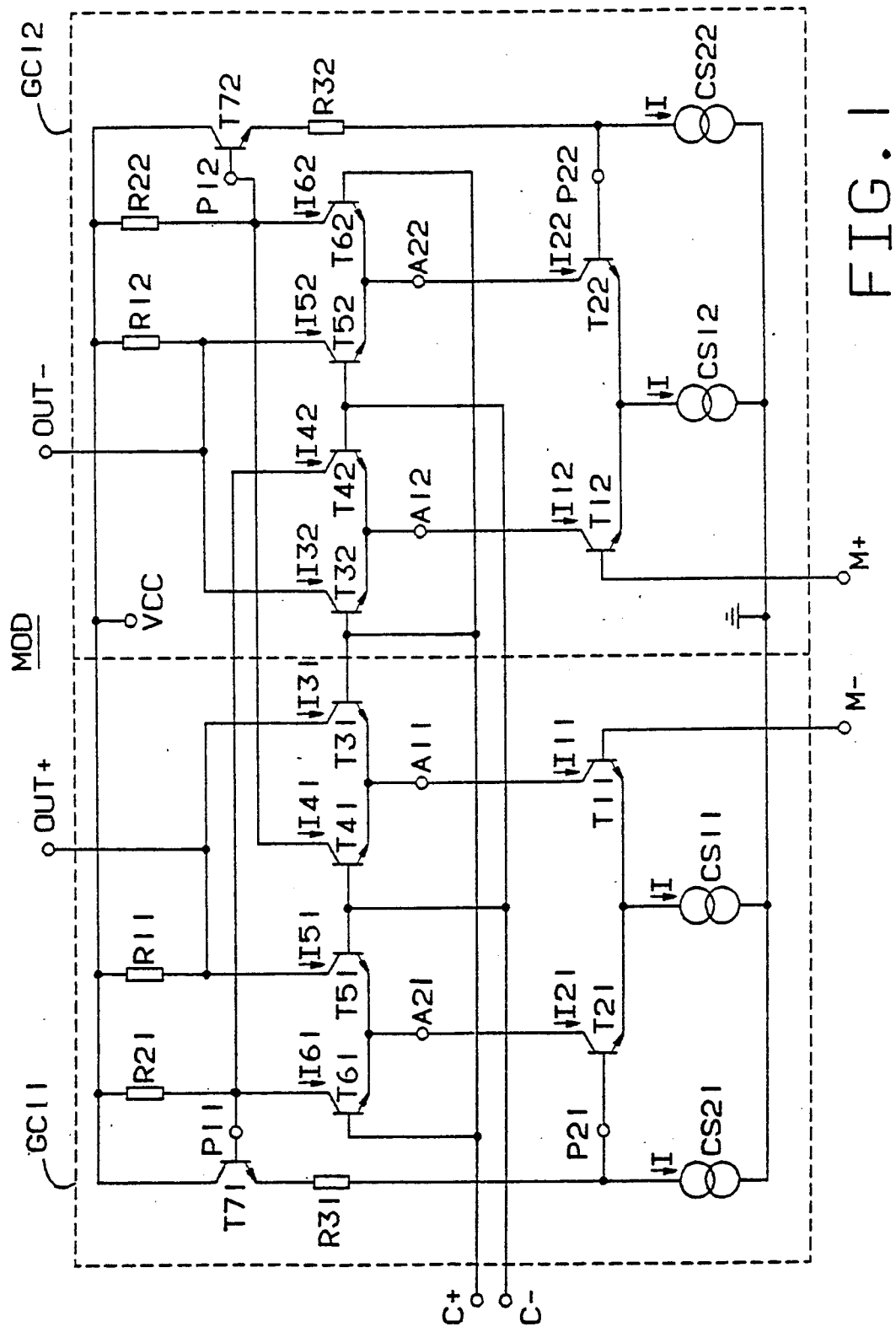
FIG. 1 is a detailed schematic diagram of a modulator circuit MOD according to the invention.

The modulator circuit MOD shown is a differential modulator used for instance in a transmitter for a mobile radio system. It operates between supply terminal VCC and ground and is adapted to modulate the amplitude of a 1 Gigahertz carrier signal C−, C+ applied at its carrier input C−, C+ by an analog modulating signal M−, M+. As a result it produces a differential modulated output signal OUT−, OUT+ on its like named output OUT−, OUT+.

In detail, the modulator circuit MOD is constituted by two cross-coupled so called Gilbert cells GC11 and GC12. Because these cells are identical corresponding elements are indicated by reference numerals which differ only in their suffixes 1 and 2.

The Gilbert cell GC11 includes three differential pairs of emitter coupled NPN transistors T11, T21; T31, T41 and T51, T61, whilst the Gilbert cell GC12 likewise includes three differential pairs of emitter coupled NPN transistors T12, T22; T32, T42 and T52, T62.

In the Gilbert cell GC11 the emitters of T11 and T21 are both connected to ground via a common constant current source CS11 and supply terminal VCC is connected to the collectors or connection points A11 and A21 of T11 and T12 via load resistor R11 in series with the collector-to-emitter paths of T31 and T51 respectively. Supply terminal VCC is also connected to the collector A11 of T11 via load resistor R22 (in GC12) and the collector-to-emitter path of T41 in series, as well as to the collector A21 of T21 via load resistor R21 and the collector-to-emitter path of T61 in series.

The junction point P11 of R21 and T61 is a correction output terminal and is connected to the base of NPN transistor T71 whose collector-to-emitter path is connected between VCC and ground in series with resistor R31 and another constant current source CS21. The junction point P21 of R31 and CS21 is a feedback input terminal connected to the base of T21.

The transistors T12, T22, T32, T52, T42, T62, T72, the current sources CS12 and CS22 and the resistors R12, R22 and R32 are connected in a similar way as described above for T11, T21, T31, T51, T41, T61, T71, CS11, CS21 and R12, R21, R31.

The bases of transistors T11 and T12 constitute the terminals M−, M+ of the modulating input M−, M+ of the modulator MOD, whose carrier input terminals C+ and C− are connected to the bases of transistors T31, T61, T32, T62 and T41, T51, T42, T52 respectively. The junction point of R11 and T31, T51 constitutes the output terminal OUT+, whilst that of R12 and T32, T52 is the output terminal OUT−.

The transistors T11, T21, T12, T22 operate in the linear mode, whereas the transistors T31, T41, T51, T61 as well as T32, T42, T52, T62 operate in switching mode. The current sources CS11, CS21, CS12 and CS22 are shown as generating a same constant current I, but the current provided by CS11 and CS12 could be different from that generated by CS21 and CS22.

The above described modulator circuit MOD may be viewed as being constituted by a modulator circuit proper, a correction signal generating circuit and a negative feedback circuit. More particularly:

the modulator circuit proper includes the cascade connection, between VCC and ground, of a first switching circuit R11, T31, T51, R12, T32, T52 having a carrier input C−, C+ and a modulator output OUT−, OUT+, and an amplifier circuit comprising two stages T11, T21, CS11 and T12, T22, CS12 and having a modulating input M−, M+ and a feedback input P21, P22;

the correction signal generating circuit includes the cascade connection, between VCC and ground, of a second switching circuit R21, T61, T42, R22, T62, T41 which is similar to the first one and also has the above carrier input C−, C+ and a correction output P11, P12, and the above amplifier circuit. Hence, the latter amplifier circuit is common to both the modulator circuit proper and the correction signal generating circuit;

a negative feedback circuit including T71, R31, CS21, T72, R32, CS22 linking the correction signal output P11, P12 to the feedback input P21, P22 of the amplifier circuit.

Figure 2:
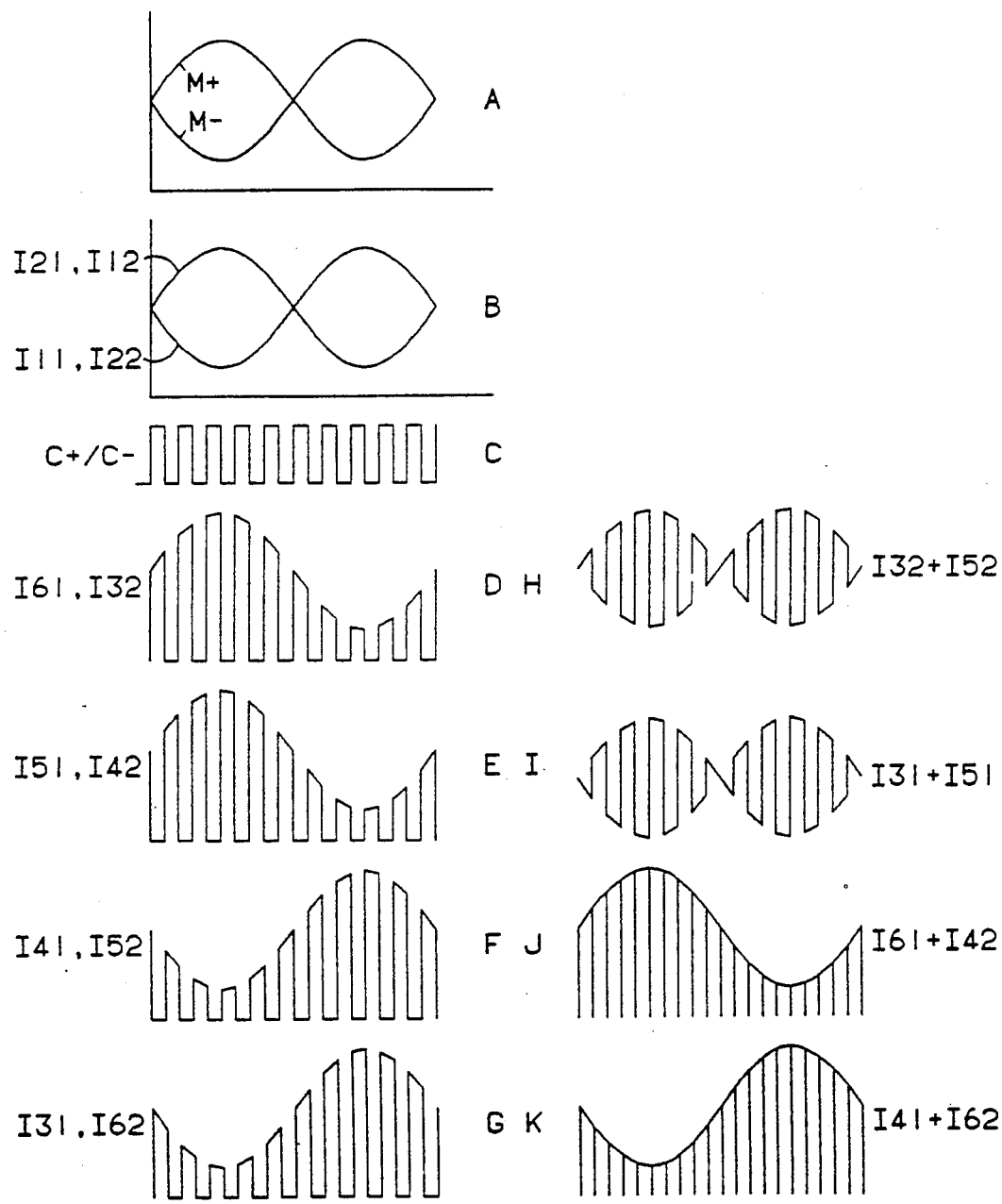
FIG. 2, A to K show signals appearing at various points of the modulator circuit of FIG. 1.

The operation of the above modulator circuit MOD is described hereafter, it being assumed that the modulating signal M−, M+ shown in FIG. 2A is applied to the modulating input M−, M+ and that the pulse-shaped carrier input signal C−, C+ represented in FIG. 2C is applied to the carrier input C−, C+. In the first instance it is also assumed that the above feedback circuit is disconnected or interrupted, but that modulating input signals M+ and M− are applied to the feedback inputs P21 and P22 respectively. This means that the modulating input signal M−, M+ is then in fact applied across terminals M− and P21 as well as between terminals P22 and M+.

Because the switching transistors T31, T61, T32, T62 and T41, T51, T42, T52 are alternately operated by the positive and negative phases of the carrier input signal C−, C+ the following happens.

In the modulator circuit proper currents are alternately allowed to flow from VCC to ground via R11, T31, T11, CS11 and R11, T51, T21, CS11. Hereby the currents I11 and I21 shown in FIG. 2B and complementary to I, flow through T11 and T21 respectively, whilst currents I31 and I51 represented in FIG. 2G and FIG. 2E flow through T31 and T51 respectively. In an analogous way currents alternately flow through R12, T32, T12, CS12 and R12, T52, T22, CS12. Hereby the currents I12 and I22 shown in FIG. 2B flow through T12 and T22 respectively, whilst the currents I32 and I52 represented in FIG. 2D and FIG. 2F flow through T32 and T52 respectively. As a result a modulated output signal I31+I51, I32+I52 shown in FIG. 2I and FIG. 2H is generated at the output OUT−, OUT+ of the modulator circuit proper. This output signal is affected by the distortion introduced by the amplifier T11, T21, CS11, T12, T22, CS12 as well as by the switching transistors T31, T51, T32, T52, the latter distortion being essentially due to the limited operation speed of these switches.

In the correction signal generating circuit currents are alternately allowed to flow from VCC to ground via R21, T61, T21, CS11 and R21, T42, T12, CS12. Hereby the currents I21 and I12 shown in FIG. 2B flow through T21 and T12 respectively, whilst the currents I61 and I42 represented in FIG. 2D and FIG. 2E flow through T61 and T42 respectively, the currents I21 and I12 being equal to I12 and I22 respectively. In an analogous way currents alternately flow through R22, T62, T22, CS12 and R22, T41, T11, CS11. Hereby the currents I22 and I11 shown in FIG. 2B flow through T22 and T11 respectively, whilst the currents I62 and I41 represented in FIG. 2G and FIG. 2F flow through T62 and T41 respectively. As a result a correction signal I61+I42, I41+I62 represented in FIG. 2J, FIG. 2K is generated at the correction output P11, P12. In the figures the vertical lines represent possible transient effects due to the limited speed of the related transistors. The correction signal is equal to the envelope of the modulated output signal because it has been submitted to the same distortion as the latter signal. Indeed it flows through the same amplifier circuit and through the switching circuit T61, T42, T62, T41 used in the correction signal generating circuit which is similar to the switching circuit T31, T51, T32, T52 used in the modulator circuit proper.

It is now supposed that the negative feedback circuit T71, R31, CS21, T72, R32, CS22 is no longer interrupted, but links-in the way shown-the correction signal output P11, P12 of the correction signal generating circuit to the feedback input P21, P22 of the amplifier circuit. As a consequence the correction signal which is equal to the envelope of the distorted modulated output signal OUT−, OUT+ is applied to the bases of the transistors T71 and T72 which are connected as emitter followers in series with respective resistances R31, R32 and respective current sources CS21, CS22. Due to the spurious capacitances of CS21 and CS22 a filtering takes place and this suppresses the above transient effects on the correction signal. Moreover, the negative feedback circuit has a lowering effect on the distortion caused in the correction signal by the amplifier circuit and the switching circuit used in the correction signal generating circuit. And due to the fact that on the one hand this amplifier circuit is used in the modulator circuit proper and that the latter, on the other hand, also makes use of a switching circuit similar to that used in the correction signal generating circuit, also the distortion of the modulated output signal is reduced. In other words the present modulator circuit has an improved linearity.

To be noted that in practice, due to the limited speed characteristics of the circuit, the signals shown in FIG. 2D to 2I are rounded off rather than having sharp vertical edges.

While the principles of the invention have been described above in connection with specific apparatus, it is to be clearly understood that this description is made only by way of example and not as a limitation on the scope of the invention.

We claim:

1. Modulator circuit (MOD) which includes the cascade connection, between the poles (VCC, ground) of a DC supply source, of a switching circuit (R11, T31, T51; R12, T32, T52) and of an amplifier circuit (T11, T21, CS11; T12, T22, CS12) and is adapted to modulate the amplitude of a carrier signal (C+, C−) applied to a carrier input (C+, C−) of said switching circuit with a modulating signal (M+, M−) applied to a modulating input (M+, M−) of said amplifier circuit, thereby producing a modulated output signal (OUT+, OUT−) at a modulator output (OUT+, OUT−) of said switching circuit, characterized in that it also includes a correction signal generating circuit (R21, T61, T42, R22, T62, T41, T11, T21, CS11, T12, T22, CS12) which also includes said amplifier circuit and derives therefrom at a correction output (P11, P12) a correction signal (P11, P12) substantially equal to the envelope of said modulated output signal, and a negative feedback circuit (T71, R31, CS21, T72, R32, CS22) linking said correction output (P11, P12) to a feedback input (P21, P22) of said amplifier circuit (T11, T21, CS11; T12, T22, CS12).

2. Modulator circuit according to claim 1, characterized in that said correction signal generating circuit (R21, T61, T42, R22, T62, T41, T11, T21, CS11, T12, T22, CS12) includes the cascade connection, between the poles (VCC, ground) of said DC supply source, of a second switching circuit (R21, T61, T42; R22, T62, T41) having said correction output (P11, P12) and of said amplifier circuit (T11, T21, CS11; T12, T22, CS12) having said feedback input (P21, P22), said second switching circuit being similar to said first mentioned switching circuit (R11, T31, T51, R12, T32, T52).

3. Modulator circuit according to claim 2, characterized in that said amplifier circuit (T11, T21, CS11, T12, T22, CS12) comprises first (T11, T21, CS11) and second (T12, T22, CS12) amplifier stages having respective terminals (M−, P21; M+, P22) of said modulating input (M−, M+) and of said feedback input (P21, P22) and having each a first (A11, A12) and a second (A21, A22) connection terminal and that one (VCC) of said poles is coupled to said connection terminals (A11, A21, A12, A22) via said second switching circuit including two series circuits comprising respective first (R22) and second (R21) impedances and respective pairs of first transistor switches (T41, T62; T42, T61), the junction points of said first (R22) and second (R21) impedances and said first transistor switches constituting the terminals of said correction output (P21, P11) respectively and the first transistor switches of each pair being controlled by opposite phases (C−, C+) of said carrier input signal.

4. Modulator circuit according to claim 3, characterized in that each of said first and second amplifier stages is a differential amplifier constituted by two emitter coupled second transistors (T11, T21; T12, T22) whose commoned emitters are coupled to the other (ground) of said poles via a constant current source (CS11, CS12), whose bases constitute a respective terminal of said modulating input (M−, M+) and a respective terminal of said feedback input (P21, P22) and whose collectors constitute said connection terminals (A11, A21; A12, A22) and that said first impedance (R22) is coupled via said first transistor switches to the first (A11) and second (A22) connection terminals of said first (T11, T21, CS1) and second (T12, T22, CS12) differential amplifiers respectively, whilst said second impedance (R21) is coupled via said first transistor switches to the first (A12) and second (A21) connection terminals of said second (T11, T22, CS12) and first (T11, T21, CS11) differential amplifiers respectively.

5. Modulator circuit according to claim 4 characterized in that collector-to-emitter paths of said first transistors are connected in series with collector-to-emitter paths of said second transistors.

6. Modulating circuit according to claim 4, characterized in that said one (VCC) of said poles is coupled to the first (A11) and second (A21) connection terminals of said first amplifier stage via a fourth impedance (R11) as well as to the first (A12) and second (A22) connection terminals of said second amplifier stage via a fifth impedance (R12), each time via the collector-to-emitter path of a first transistor switch forming part of said first mentioned switching circuit.

7. Modulator circuit according to claim 3, characterized in that each of the terminals (P12, P11) of said correction output is connected to the base of a third transistor (T72, T71) whose collector-to-emitter path is coupled between said poles (VCC, ground) in series with a third impedance (R32; R31) and a second constant current source (CS22, CS21), the junction point of said third impedance and said second constant current source constituting a respective terminal of said feedback input (P21, P22).

* * * * *